United States Patent
Huang et al.

(10) Patent No.: US 10,312,393 B2
(45) Date of Patent: Jun. 4, 2019

(54) SOLAR POWER MODULE

(71) Applicant: Eterbright Solar Corporation, Miaoli County (TW)

(72) Inventors: Ting-Hui Huang, Miaoli County (TW); Chen-Nan Chou, Miaoli County (TW)

(*) Notice: Subject to any disclaimer, the term of this patent is extended or adjusted under 35 U.S.C. 154(b) by 0 days.

(21) Appl. No.: 15/173,846

(22) Filed: Jun. 6, 2016

(65) Prior Publication Data

US 2017/0301812 A1    Oct. 19, 2017

(30) Foreign Application Priority Data

Apr. 14, 2016 (TW) .............................. 105205174 U

(51) Int. Cl.
| | |
|---|---|
| H02N 6/00 | (2006.01) |
| H01L 31/042 | (2014.01) |
| H01L 31/048 | (2014.01) |
| H02S 30/10 | (2014.01) |
| H02S 40/22 | (2014.01) |
| H01L 31/049 | (2014.01) |

(52) U.S. Cl.
CPC ........ H01L 31/0481 (2013.01); H01L 31/049 (2014.12); H02S 30/10 (2014.12); H02S 40/22 (2014.12); Y02E 10/52 (2013.01)

(58) Field of Classification Search
CPC .................................................. H01L 31/0481
See application file for complete search history.

(56) References Cited

U.S. PATENT DOCUMENTS

| | | | | |
|---|---|---|---|---|
| 5,460,660 A | * | 10/1995 | Albright | H02S 30/10 136/251 |
| 2009/0050195 A1 | * | 2/2009 | Ogasahara | H02S 20/00 136/251 |
| 2010/0065116 A1 | * | 3/2010 | Stancel | B32B 17/10045 136/256 |
| 2010/0263724 A1 | * | 10/2010 | Tazawa | H02S 20/00 136/259 |
| 2010/0282293 A1 | * | 11/2010 | Meyer | H01L 31/049 136/244 |
| 2013/0125984 A1 | * | 5/2013 | Huang | F24J 2/5211 136/259 |
| 2014/0060625 A1 | * | 3/2014 | Beuke | H01L 31/0203 136/251 |
| 2014/0137939 A1 | * | 5/2014 | Higashi | H01L 31/0481 136/259 |

FOREIGN PATENT DOCUMENTS

| | | |
|---|---|---|
| EP | 0 860 886 A2 | 8/1998 |
| EP | 2 595 199 A2 | 5/2013 |
| JP | 2006100392 A | 4/2006 |

* cited by examiner

*Primary Examiner* — Angelo Trivisonno

(57) ABSTRACT

A solar power module includes a solar panel, a metallic frame, a soft insulation glue material, and a hard insulation spacer. The solar panel is embedded in the metallic frame. The metallic frame includes an upper portion, an intermediate portion, and a lower portion. The soft insulation glue material is adapted to wrap at least one portion of an edge of the solar panel. The soft insulation glue material is fixedly disposed in the metallic frame. The soft insulation glue material to wrap the solar panel is divided into an upper part, an intermediate part, and a lower part. The hard insulation spacer is disposed between the solar panel and the lower portion of the metallic frame.

7 Claims, 6 Drawing Sheets

SOLAR POWER MODULE

CROSS REFERENCE TO RELATED APPLICATIONS

This non-provisional application claims priority under 35 U.S.C. § 119(a) on Patent Application No(s). 105205174 filed in Taiwan, R.O.C. on Apr. 14, 2016, the entire contents of which are hereby incorporated by reference.

BACKGROUND OF THE INVENTION

Field of the Invention

The present invention relates to a solar power module, and more particularly to a solar power module having a hard insulation spacer.

Description of Related Art

An existing solar power module often uses an aluminum alloy frame to secure an interior solar panel in order to increase its entire strength. However, it is easy to generate parasitic capacitance between the solar panel and the aluminum alloy frame, which will influence the photoelectric conversion efficiency. If the solar power module is a thin-film solar power cell (the back panel of a thin-film solar power cell is thinner than the back panel of a monocrystalline silicon solar cell or the back panel of a polycrystalline silicon solar cell), the solar power module is often provided with a layer of aluminum film inside the back panel of the thin-film solar power cell to increase the strength of the back panel. However, two side edges of the aluminum film and the aluminum alloy frame generate additional parasitic capacitance. Thus, the thin-film solar power cell will generate more parasitic capacitance. A solution to this problem is to enlarge the distance between the aluminum film and the aluminum alloy frame. For example, when the solar panel 11 is embedded in the aluminum alloy frame 12, double sided foam tape 13 is attached to the side end of the solar panel 11, referring to FIG. 1. FIG. 1 is a longitudinal sectional view of a conventional solar power module 10. The double sided foam tape 13 is used to increase the distance between the solar panel 11 and the aluminum alloy frame 12. However, after a long period of time, the lower portion of the double sided foam tape 13 becomes thinner due to being compressed by the solar panel 11. As a result, the parasitic capacitance generated by the aluminum alloy frame 12 and the solar panel 11 becomes more and more. The improvement is limited. It is worth for the person skilled in the art to consider how to reduce the parasitic capacitance generated by the solar power module. Accordingly, the inventor of the present invention has devoted himself based on his many years of practical experiences to solve these problems.

SUMMARY OF THE INVENTION

The primary object of the present invention is to provide a solar power module which can decrease parasitic capacitance effectively.

In order to achieve the aforesaid object, the solar power module of the present invention comprises a solar panel, a metallic frame, a soft insulation glue material, and a hard insulation spacer. The solar panel is embedded in the metallic frame. The metallic frame comprises an upper portion, an intermediate portion, and a lower portion. The soft insulation glue material is adapted to wrap at least one portion of an edge of the solar panel. The soft insulation glue material is fixedly disposed in the metallic frame. The soft insulation glue material to wrap the solar panel is divided into an upper part, an intermediate part, and a lower part. The hard insulation spacer is disposed between the solar panel and the lower portion of the metallic frame.

In the aforesaid solar power module, the hard insulation spacer separates the lower part of the soft insulation glue material from the metallic frame.

In the aforesaid solar power module, the hard insulation spacer separates the lower part of the soft insulation glue material from the solar panel.

In the aforesaid solar power module, the solar panel has a rectangular shape, the solar panel comprises a glass panel, a main layer, and a back panel, and the back panel includes a metallic film.

In the aforesaid solar power module, the hard insulation spacer has a □-like shape, and the hard insulation spacer is disposed beneath the solar panel to surround the edge of the solar panel.

In the aforesaid solar power module, either side of the hard insulation spacer has a width not less than a depth of the solar panel embedded into the metallic frame.

In the aforesaid solar power module, the hard insulation spacer has a height greater than a critical height.

In the aforesaid solar power module, the critical height is 0.5 mm.

In the aforesaid solar power module, the hard insulation spacer is made of polyethylene terephthalate (PET) or acryl.

In the aforesaid solar power module, the soft insulation glue material is a waterproof glue material.

Embodiments of the present invention will now be described, by way of example only, with reference to the accompanying drawings.

DESCRIPTION OF THE INVENTION

Figure 1:
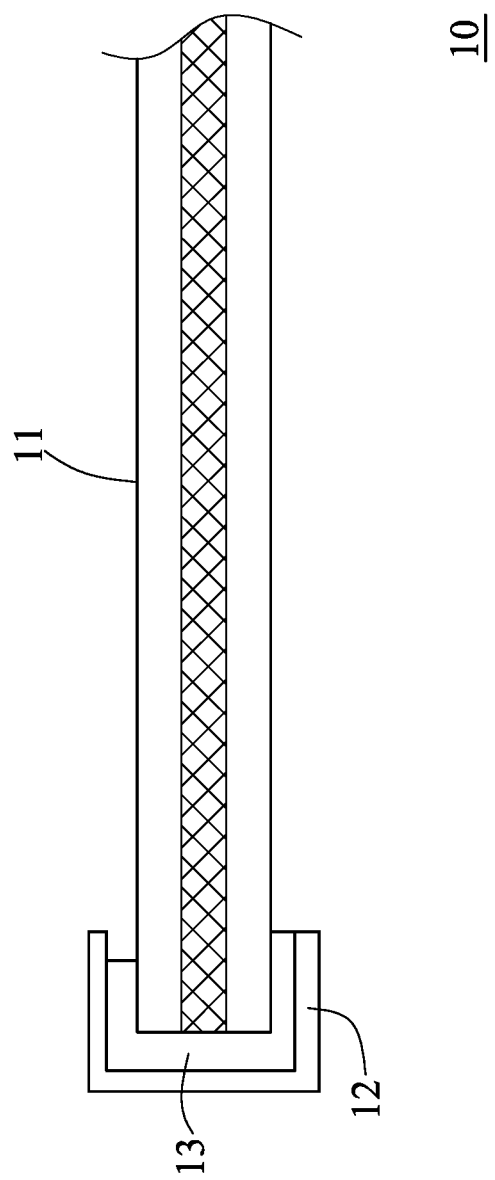
FIG. 1 is a longitudinal sectional view of a conventional solar power module 10.
Figure 2:
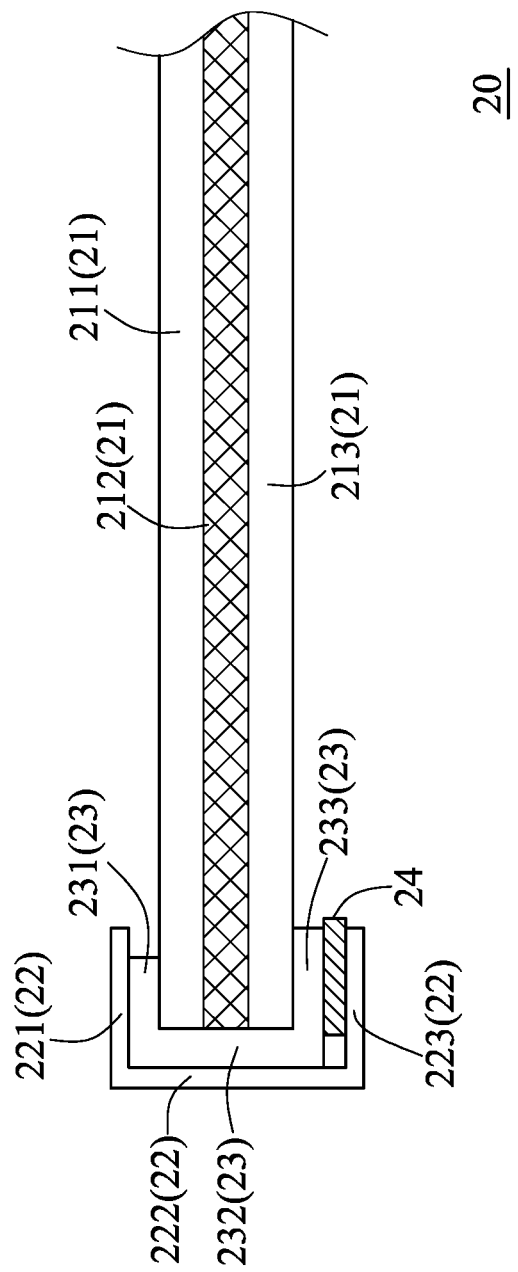
FIG. 2 is a longitudinal sectional view of a solar power module 20 in accordance with a preferred embodiment of the present invention.
Figure 3:
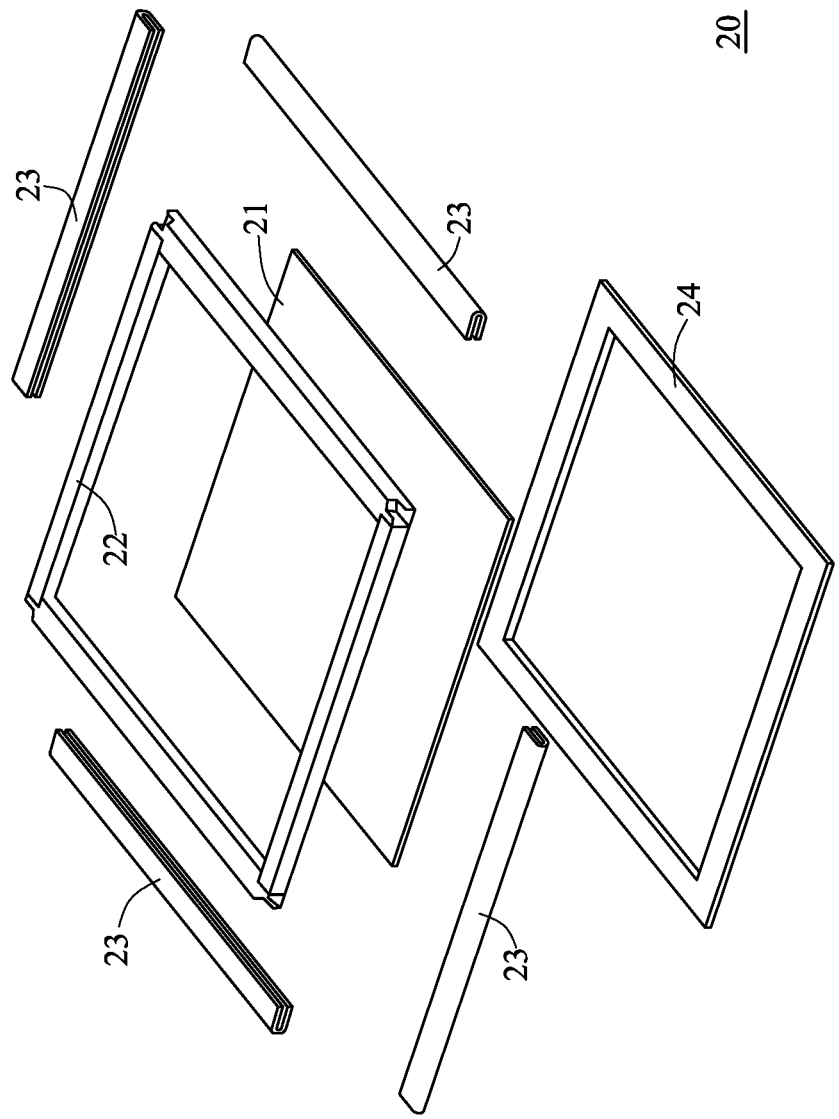
FIG. 3 is an exploded view of the solar power module 20 in accordance with the preferred embodiment of the present invention.

FIG. 2 is a longitudinal sectional view of a solar power module 20 in accordance with a preferred embodiment of the present invention. FIG. 3 is an exploded view of the solar power module 20 in accordance with the preferred embodiment of the present invention. The solar power module 20 comprises a solar panel 21, a metallic frame 22, a soft insulation glue material 23, and a hard insulation spacer 24. The solar panel 21 may be a monocrystalline silicon solar cell, a polycrystalline silicon solar cell, or a thin-film solar cell. The solar panel 21 has a rectangular shape, and comprises a main layer 212, a glass panel 211, and a back panel 213. The metallic frame 22 comprises an upper portion 221, an intermediate portion 222, and a lower portion 223. The glass panel 211 is disposed on top of the main layer 212. The back panel 213 is disposed beneath the main layer 212. The soft insulation glue material 23 is adapted to wrap at least one portion of an edge of the solar panel 21. Preferably, the soft insulation glue material 23 is to surround the edge of the solar panel 21. The soft insulation glue material 23 to wrap the solar panel 21 is divided into an upper part 231, an intermediate part 232, and a lower part 233. The solar panel 21 wrapped by the soft insulation glue material 23 is embedded into the metallic frame 22, so that the soft insulation glue material 23 is fixedly disposed in the metallic frame 22. In addition, the hard insulation spacer 24 is disposed beneath the lower part 233 of the soft insulation glue material 23 and attached to lower part 233 tightly. The hard insulation spacer 24 has a height greater than a critical height. The distance of the critical height is a safe distance capable of preventing parasitic capacitance between the metallic frame 22 and the solar panel 21. The critical height is 0.5 mm. Preferably, the critical height is 1 mm. Thus, the hard insulation spacer 24 can separate the lower part 233 of the soft insulation glue material 23 from the metallic frame 22 effectively. Compared to the conventional solar power module 10, even if the lower part 233 of the soft insulation glue material 23 of the solar power module 20 of this embodiment becomes thin or is damaged, the hard insulation spacer 24 enables the solar panel 21 to be spaced at a safe distance from the lower portion 223 of the metallic frame 22, so that the solar panel 21 and the metallic frame 22 won't generate parasitic capacitance easily. The soft insulation glue material 23 can be a waterproof glue material, such as foam tape or butyl rubber. The hard insulation spacer 24 is made of polyethylene terephthalate (PET) or acryl. The metallic frame 22 is made of aluminum or aluminum alloy.

Figure 4:
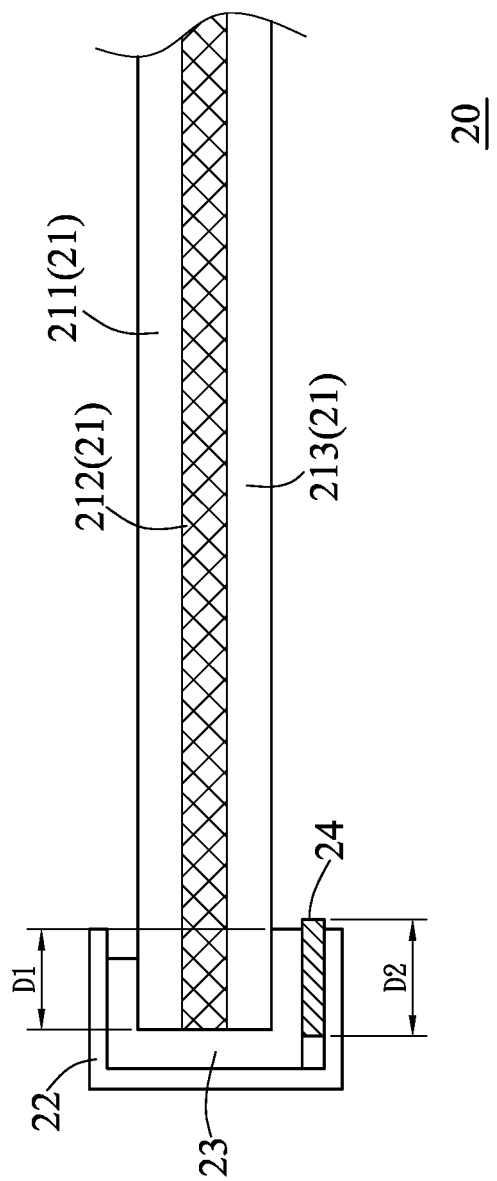
FIG. 4 is a longitudinal sectional view of the solar power module 20 of the present invention.

When the solar panel 21 is a thin-film solar cell, it may be curved easily because the edge of the main layer 212 of the thin-film solar cell is not perfectly rigid. Therefore, the hard insulation spacer 24 has a □-like shape, referring to FIG. 3. The hard insulation spacer 24 is disposed beneath the solar panel 21 to surround the edge of the solar panel 21. That is to say, the hard insulation spacer 24 is attached to the whole metallic frame 22. Furthermore, the width of either side of the hard insulation spacer 24 is not less than the depth of the solar panel 21 embedded into the metallic frame 22. For example, the width of one side of the hard insulation spacer 24 as shown in FIG. 4 (FIG. 4 is a longitudinal sectional view of the solar power module 20) is D2, and the depth of the solar panel 21 embedded into the metallic frame 22 is D1. D2 is greater than or equal to D1 (D2≥D1). Thus, the edge of the main layer 212 won't be deformed to shorten the distance between the edge of the main layer 212 and the metallic frame 22.

Figure 5:
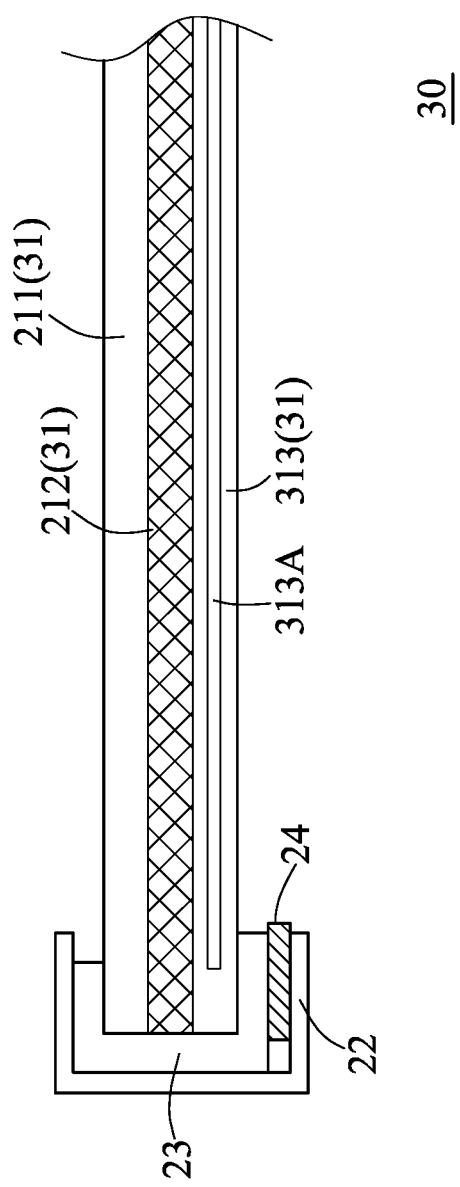
FIG. 5 is a longitudinal sectional view of a solar power module 30 in accordance with another embodiment of the present invention.

FIG. 5 is a longitudinal sectional view of a solar power module 30 in accordance with another embodiment of the present invention. The solar power module 30 is derived from the solar power module 20. The back panel 313 of the solar panel 31 of the solar power module 30 further comprises a metallic film 313A therein to enhance the strength of the back panel 313. The solar power module 30 also has the soft insulation glue material 23 and the hard insulation spacer 24 to separate the back plate 313 from the metallic frame 22, such that the metallic film 313A inside the back plate 313 and the metallic frame 22 won't generate parasitic capacitance easily. The metallic film 313A is made of aluminum or aluminum alloy. As shown in FIG. 5, the metallic film 313A and the metallic frame 22 are overlapped up and down, alternatively, the metallic film 313A is smaller in size and doesn't totally overlap over the metallic frame 22 (not shown in the drawing) further to lower the possibility of the parasitic capacitance generated by the metallic film 313A and the metallic frame 22.

Figure 6:
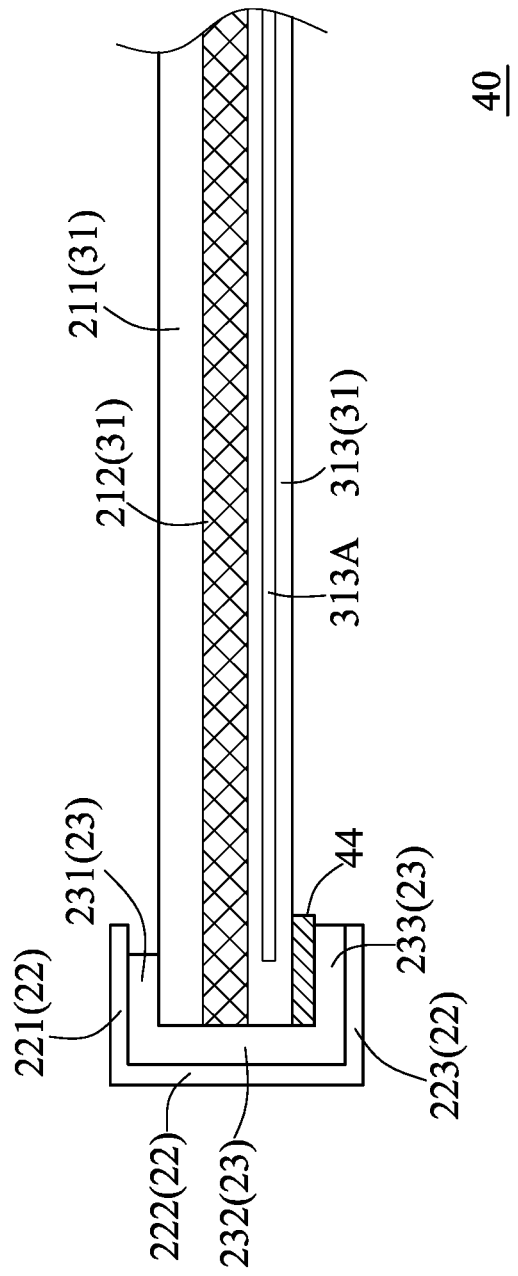
FIG. 6 is a longitudinal sectional view of a solar power module 40 in accordance with a further embodiment of the present invention.

FIG. 6 is a longitudinal sectional view of a solar power module 40 in accordance with a further embodiment of the present invention. The solar power module 40 is derived from the solar power module 30. The solar power module 40 is substantially similar to the solar power module 30 with the exceptions described hereinafter. The hard insulation spacer 24 of the solar power module 30 is disposed beneath the lower part 233 of the soft insulation glue material 23, but the hard insulation spacer 44 of the solar power module 40 is disposed over the lower part 233 of the soft insulation glue material 23. The hard insulation spacer 44 of the solar power module 40 is to separate the lower part 233 of the soft insulation glue material 23 from the solar panel 31. Thus, even if the lower part 233 of the soft insulation glue material 23 of the solar power module 40 becomes thin or is damaged, the hard insulation spacer 44 enables the solar panel 21 to be spaced at a safe distance from the lower portion 223 of the metallic frame 22, so that the solar panel 21 and the metallic frame 22 won't generate parasitic capacitance easily, and the metallic film 313A and the metallic frame 22 won't generate parasitic capacitance easily.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A solar power module, comprising:
a solar panel;
a metallic frame, the solar panel being embedded in the metallic frame, the metallic frame comprising an upper portion, an intermediate portion, and a lower portion;
an insulation glue material, the insulation glue material being adapted to wrap at least one portion of an edge of the solar panel, the insulation glue material to wrap the solar panel being divided into an upper part, an intermediate part, and a lower part; and
an insulation spacer, the insulation spacer being disposed between the solar panel and the lower portion of the metallic frame;
wherein the insulation spacer separates the lower part of the insulation glue material from the metallic frame, the insulation spacer has a height greater than a critical height, and the critical height is 0.5 mm.

2. The solar power module as claimed in claim 1, wherein the hard insulation spacer separates the lower part of the soft insulation glue material from the solar panel.

3. The solar power module as claimed in claim 1, wherein the solar panel has a rectangular shape, the solar panel comprises a glass panel, a main layer, and a back panel, and the back panel includes a metallic film.

4. The solar power module as claimed in claim 1, wherein the insulation spacer has a □-like shape, and the insulation spacer is disposed beneath the solar panel to surround the edge of the solar panel.

5. The solar power module as claimed in claim 1, wherein either side of the insulation spacer has a width not less than a depth of the solar panel embedded into the metallic frame.

6. The solar power module as claimed in claim 1, wherein the insulation spacer is made of polyethylene terephthalate (PET).

7. The solar power module as claimed in claim 1, wherein the insulation glue material is a waterproof glue material.

\* \* \* \* \*